(12) United States Patent
Wu et al.

(10) Patent No.: US 9,775,234 B2
(45) Date of Patent: Sep. 26, 2017

(54) FLEXIBLE ELECTRONIC DEVICE

(71) Applicant: Industrial Technology Research Institute, Hsinchu (TW)

(72) Inventors: Cheng-Che Wu, New Taipei (TW); Chen-Chu Tsai, Taichung (TW); Chia-Hao Tsai, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 212 days.

(21) Appl. No.: 14/691,588

(22) Filed: Apr. 21, 2015

(65) Prior Publication Data
US 2016/0143130 A1    May 19, 2016

(30) Foreign Application Priority Data
Nov. 19, 2014  (TW) .............................. 103140053 A

(51) Int. Cl.
H05K 1/00   (2006.01)
H05K 1/02   (2006.01)

(52) U.S. Cl.
CPC ........... *H05K 1/028* (2013.01); *H05K 1/0281* (2013.01); *H05K 2201/055* (2013.01)

(58) Field of Classification Search
CPC . H05K 1/028; H05K 1/0281; H05K 2201/055
See application file for complete search history.

(56) References Cited

U.S. PATENT DOCUMENTS

| 7,486,017 B2 | 2/2009 | Ohkubo |
| 7,531,957 B2 | 5/2009 | Sakamoto |
| 2002/0189854 A1 | 12/2002 | Crumly |

(Continued)

FOREIGN PATENT DOCUMENTS

| JP | 2001223445 | 8/2001 |
| TW | 200511882 | 3/2005 |

(Continued)

OTHER PUBLICATIONS

"Office Action of Taiwan Counterpart Application", dated Mar. 21, 2016, p. 1-p. 7, in which the listed references were cited.

(Continued)

*Primary Examiner* — Yuriy Semenenko
(74) *Attorney, Agent, or Firm* — Jianq Chyun IP Office

(57) ABSTRACT

A flexible electronic device including a flexible panel and an auxiliary layer is provided. The flexible panel has a plurality of operation portions, wherein a predetermined bending portion disposed between each adjacent two of the operation portions. The auxiliary layer is disposed on a surface of the flexible panel and at least located above the predetermined bending portion. The predetermined bending portion of the flexible panel may be bent in a first bending state for the auxiliary layer to be in contact with the predetermined bending portion, and a radius of curvature of the auxiliary layer is greater than a radius of curvature of the predetermined bending portion. The flexible electronic device has a first compressive stress region and a first tensile stress region, and a range of the first compressive stress region is greater than a range of the first tensile stress region.

20 Claims, 10 Drawing Sheets

(56) References Cited

U.S. PATENT DOCUMENTS

| | | | | |
|---|---|---|---|---|
| 2006/0132027 A1* | 6/2006 | Gao | ............... | H01L 51/0097 |
| | | | | 313/506 |
| 2007/0080627 A1* | 4/2007 | Sakamoto | ........... | H01L 51/5237 |
| | | | | 313/504 |
| 2012/0256720 A1 | 10/2012 | Byun et al. | | |
| 2014/0168880 A1 | 6/2014 | Saila et al. | | |
| 2016/0028032 A1* | 1/2016 | Okada | ............ | H01L 51/0097 |
| | | | | 257/40 |

FOREIGN PATENT DOCUMENTS

| | | |
|---|---|---|
| TW | 201203196 | 1/2012 |
| TW | 201417267 | 5/2014 |
| WO | 2014136259 | 9/2014 |

OTHER PUBLICATIONS

Shao-Kai Lu, et al., "Flexibility of the Indium Tin Oxide Transparent Conductive Film Deposited Onto the Plastic Substrate," Smart Science, vol. 2, No. 1, Mar. 2014, pp. 7-pp. 12.

Dong-Un Jin, "Highly Robust Flexible AMOLED Display on Plastic Substrate with New Structure," SID Symposium Digest of Technical Papers, vol. 41, Issue 1, May 2010, pp. 703-705.

* cited by examiner

FLEXIBLE ELECTRONIC DEVICE

CROSS-REFERENCE TO RELATED APPLICATION

This application claims the priority benefit of Taiwan application serial no. 103140053, filed on Nov. 19, 2014. The entirety of the above-mentioned patent application is hereby incorporated by reference herein and made a part of this specification.

TECHNICAL FIELD

The present disclosure relates to a flexible electronic device.

BACKGROUND

With the blooming development of the electronic products, a fixed and rigid product may no longer satisfy demands in the consumer market. With continuous breakthrough in electronic technology, flexible materials are constantly developed and successfully introduced as new products. Components and layers in a flexible electronic device may have a certain degree of brittleness, which limits a flexibility of the flexible electronic device. For instance, the components and the layers are prone to damages caused by receiving undue stresses when the flexible electronic device is bent. Therefore, there are improvements to be made for flexible products.

SUMMARY

A flexible electronic device including a flexible panel and an auxiliary layer is provided according to an embodiment of the present disclosure. The flexible panel has a plurality of operation portions and a predetermined bending portion disposed between each adjacent two of the operation portions. The auxiliary layer is disposed on a surface of the flexible panel and at least located above the predetermined bending portion. When the predetermined bending portion of the flexible panel is in a first bending state, the auxiliary layer is in contact with the predetermined bending portion, and a radius of curvature of the auxiliary layer is greater than a radius of curvature of the predetermined bending portion. The flexible electronic device has a first compressive stress region and a first tensile stress region, and a range of the first compressive stress region is greater than a range of the first tensile stress region.

A flexible electronic device including a flexible panel and an auxiliary layer is provided according to another embodiment of the present disclosure. The flexible panel has a plurality of operation portions and a predetermined bending portion disposed between each adjacent two of the operation portions. The auxiliary layer is disposed on a surface of the flexible panel and at least located above the predetermined bending portion. When the predetermined bending portion of the flexible panel is in a first bending state, the auxiliary layer is in contact with the predetermined bending portion, and a radius of curvature of the auxiliary layer is greater than a radius of curvature of the predetermined bending portion. When the predetermined bending portion of the flexible panel is in a second bending state, the auxiliary layer is not in contact with the predetermined bending portion.

To make the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION

Figure 1A:
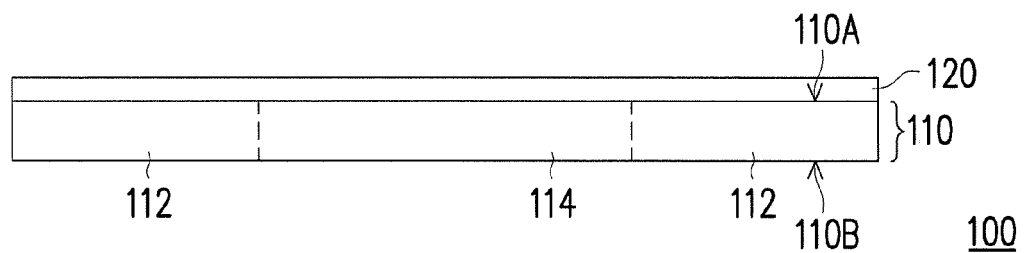
FIG. 1A is a cross-sectional view of a flexible electronic device according to an embodiment of the present disclosure.

In the following detailed description, for purposes of explanation, numerous details are set forth in order to provide a thorough understanding of the disclosed embodiments. It will be clear, however, that one or more embodiments may be practiced without these details. In other instances, well-known structures and devices are schematically shown in order to simplify the drawing.

Figure 1B:
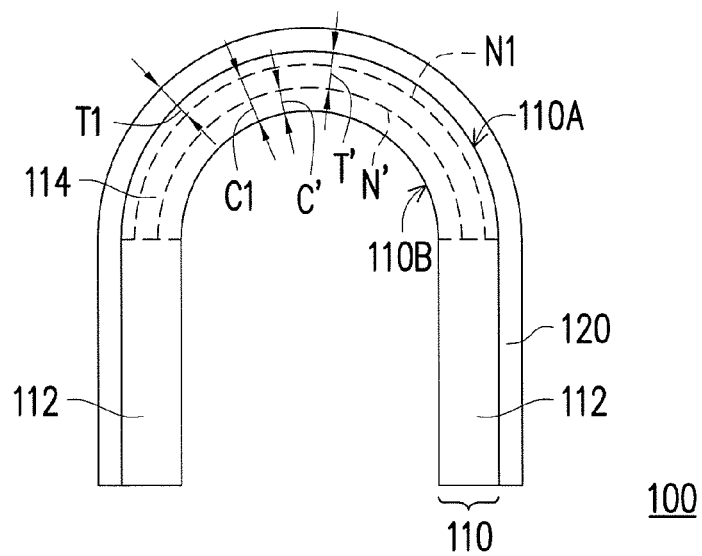
FIG. 1B is a schematic diagram of the flexible electronic device of FIG. 1A in a first bending state.
Figure 1C:
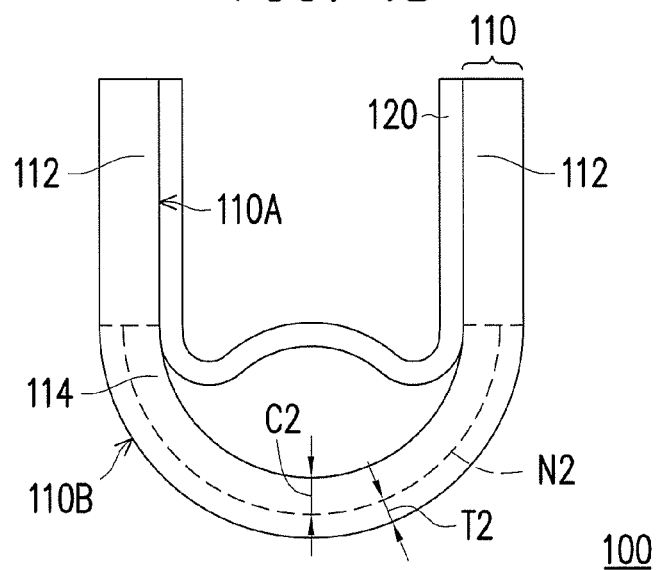
FIG. 1C is a schematic diagram of the flexible electronic device of FIG. 1A in a second bending state.

FIG. 1A is a cross-sectional view of a flexible electronic device according to an embodiment of the present disclosure, FIG. 1B is a schematic diagram of the flexible electronic device of FIG. 1A in a first bending state, and FIG. 1C is a schematic diagram of the flexible electronic device of FIG. 1A in a second bending state. Referring to FIG. 1A, a flexible electronic device 100 includes a flexible panel 110 and an auxiliary layer 120. The flexible panel 110 has a plurality of operation portions 112 and a predetermined bending portion 114 disposed between each adjacent two of the operation portions 112. The operation portions 112 may be regarded as a major portion for providing functions such as displaying, touch operations and sensing and so on, whereas the predetermined bending portion 114 allows users to bend the entire device along the predetermined bending portion 114 when using the flexible electronic device 100. However, the present disclosure is not intended to exclude that the predetermined bending portion 114 may also provide the functions such as displaying, touch operations and sensing and so on.

When the predetermined bending portion 114 is in a bending state, components and layers in the predetermined bending portion 114 may receive stress generated corresponding to the bending state. The components are prone to damages if properties thereof are relatively brittle. For example, under a tensile stress, a possibility for the components to be damaged is high, and this limits an operating lifetime of the flexible electronic device 100. The auxiliary layer 120 is disposed on a surface 110A or a surface 110B of the flexible panel 110 in the present embodiment, and the auxiliary layer 120 is at least located above the predetermined bending portion 114, so as to lower the possibility for the components to be damaged by a bending stress.

The present embodiment is described by taking the auxiliary layer 120 that is disposed on the surface 110A as an example. The flexible electronic device 100 may at least be bent according to the following two manners. Referring FIG. 1A and FIG. 1B, in the first bending state, as shown in FIG. 1B, the predetermined bending portion 114 is bent such that the auxiliary layer 120 is located at an outer side. In this case, the auxiliary layer 120 is in contact with the predetermined bending portion 114. Herein, the so-called outer side refers to, for example, one side having a greater radius of curvature in the bending state. Take FIG. 1B for example, a side where the surface 110A of the flexible panel 110 is located is the outer side, whereas a side where the surface 110B is located is an inner side.

In such bending state, the flexible electronic device 100 may be divided into a tensile stress region T1 and a compressive stress region C1 by the neutral axis N1 according to the states of stress being received, in which the auxiliary layer 120 is in contact with the predetermined bending portion 114 and located in the tensile stress region T1. In the present embodiment, in the bending state of FIG. 1B, a range of the compressive stress region C1 may be greater than a range of the tensile stress region T1. In such bending state, a neutral axis N1 for reflecting a stress balance is closer to the surface 110A and farther from the surface 110B. It is worth mentioning that, the so-called tensile stress region T1, the compressive stress region C1 and the neutral axis N1 are obtained according a measurement result of stresses or from a simulation of known element structures and materials, and the neutral axis N1 is a common border of the compressive stress region C1 and the tensile stress region T1 in sectional view. In view of the entire device, the boundary between the compressive stress region C1 and the tensile stress region T1 constitutes a neutral plane (the neutral axis N1).

In the present embodiment, the auxiliary layer 120 is, for example, attached on the operation portions 112 by an adhesion layer or an adhesion material, and the adhesion layer or the adhesion material may not be disposed between the auxiliary layer 120 and the predetermined bending portion 114. Therefore, in another bending state, as shown in FIG. 1C, when the predetermined bending portion 114 is bent such that the auxiliary layer 120 is located in the inner side, the auxiliary layer 120 is not in contact with the predetermined bending portion 114. In the bending state of FIG. 1C, the auxiliary layer 120 is surrounded by the two operation portions 112 and the predetermined bending portion 114. The tensile stress region T2 is adjacent to the surface 110B and located between the surface 110B and the neutral axis N2 such that the auxiliary layer 120 is closer to the compressive stress region C2 and farther from the tensile stress region T2. In this case, in order to avoid increases in the range of the tensile stress region T2, the auxiliary layer 120 may not be in contact with the predetermined bending portion 114, so as to prevent the elements from damages during a bending process.

In view of FIG. 1B and FIG. 1C, when the auxiliary layer 120 is in contact with the predetermined bending portion 114, the neutral axis N1 may be closer to the surface 110A as compared to the neutral axis N2 when the auxiliary layer 120 is not in contact with the predetermined bending portion 114. A position of the neutral axis N1/N2 may be dynamically adjusted by configuring the auxiliary layer 120 in the present embodiment, so as to reduce negative impacts caused by the bending stress to the flexible electronic device 100. The tensile stress region T1 in the bending state of FIG. 1B may become the compressive stress region C2 in the bending state of FIG. 1C, vice versa.

For most of materials, a yield strength for the tensile stress is often lower than a yield strength for the compressive stress. If the stress received by a material is greater than the yield strength thereof, breakages or damages may occur on the material. Therefore, in the bending state, if the tensile stress region is greater, it is more likely that more materials are in an unsafe state. In the present embodiment, the auxiliary layer 120 is in contact with the predetermined bending portion 114 such that the position of the neutral axis N1 shifts towards the surface 110A. Therefore, when the auxiliary layer 120 is not attached, if the flexible panel 110 is bent in the manner of FIG. 1B, a neutral axis N' is farther from the surface 110A. In other words, if a range of a tensile stress region T' is greater, a range of a compressive stress region C' is smaller. In this case, it is possible that most of the components in the flexible panel 110 are located in the tensile stress region T' between the neutral axis N' and the surface 110A and prone to damages. However, in the present embodiment, after the auxiliary layer 120 is disposed and when the flexible panel 110 is bent in the manner of FIG. 1B, the neutral axis N1 may shift closer to the surface 110A, so as to reduce the range of the tensile stress region T1 in such bending state to thereby lower the possibility for the elements to be damaged caused by the range of the tensile stress region T1 being greater. In addition, when it is required to dispose a stress sensing element (not illustrated) in the flexible electronic device 100, the stress sensing element may be disposed in the tensile stress region T1 in order to sensing a stress condition of the device more sensitively.

In addition, the neutral axis N1 may shift towards the auxiliary layer 120 further if a thickness or a rigidity of the auxiliary layer 120 is increased. Accordingly, designers may change the position of the neutral axis N1 by adjusting the material and thickness of the auxiliary layer 120. In an embodiment, the design of the material and the thickness of the auxiliary layer 120 allows all the components or the layers with the brittle properties in the predetermined bending portion 114 to be disposed in the compressive stress region C1 as depicted in FIG. 1B, so as to delay a time for damaging these components or layers due to the bending. For instance, in an embodiment, the material of the auxiliary layer 120 may include, for example, a polymer material. The polymer material may be, for example, a polyester, a polypropylene, an acrylonitrile butadiene styrene (ABS) copolymer, but the present disclosure is not limited thereto. A Young's modulus of the auxiliary layer 120 may be, for example, between 0.2 GPa to 8 GPa. Further, a stiffness of the flexible panel 110 may be greater than or equal to a stiffness of the auxiliary layer 120. For instance, a ratio of the stiffness of the auxiliary layer 120 to the stiffness of the flexible panel 110 may be 1:3. In an embodiment, the auxiliary layer 120 may facilitate in changing the position of the neutral axis and may also provide special functions in order to serve a polarizer film, an anti-glare film, an anti-scratch film, a carrier for supporting touching sensing elements or an optical film for enhancing optical efficiency.

Figure 1D:
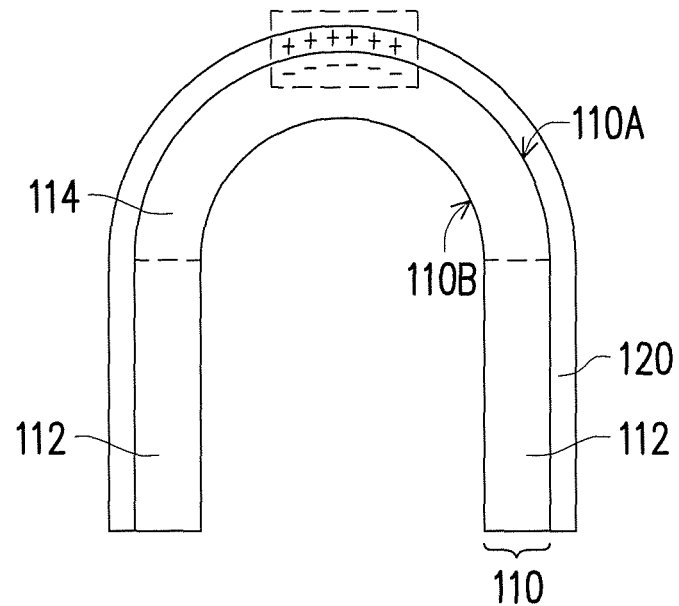
FIG. 1D to FIG. 1G are schematic diagrams illustrating an implementation of the auxiliary layer and the predetermined bending portion in the flexible electronic device which are respectively in contact to each other as depicted in FIG. 1B and not in contact with each other as depicted in FIG. 1C.
Figure 1E:
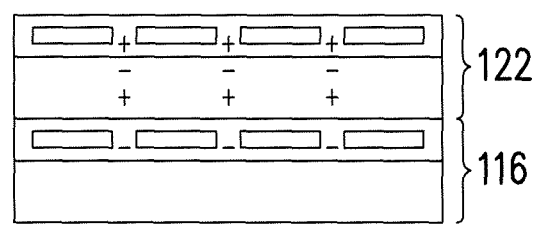
Figure 1F:
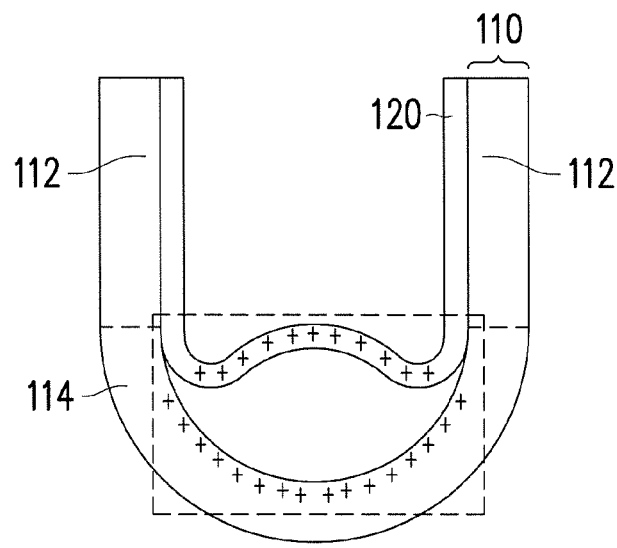
Figure 1G:
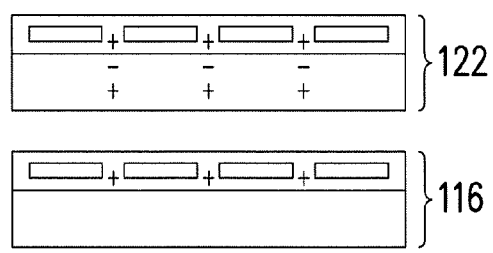

FIG. 1D to FIG. 1G are schematic diagrams illustrating an implementation of the auxiliary layer and the predetermined bending portion in the flexible electronic device which are respectively in contact with each other as depicted in FIG. 1B and not in contact with each other as depicted in FIG. 1C. Referring to FIG. 1D and FIG. 1E first, the flexible panel 110 has a first electrostatic element 116 as depicted in FIG. 1E, and the first electrostatic element 116 is disposed in the predetermined bending portion 114 or a surface thereof. The auxiliary layer 120 has a second electrostatic element 122, and the second electrostatic element 122 is disposed corresponding to the first electrostatic element 116. In a bending state of FIG. 1D (identical to the bending state of FIG. 1B), the first electrostatic element 116 and the second electrostatic element 122 may attract each other. In such bending state, the auxiliary layer 120 is in contact with the predetermined bending portion 114. Further, referring to FIG. 1F and FIG. 1G, in such bending state (identical to the bending state of FIG. 1C), the auxiliary layer 120 is surrounded by the two of the operation portions 112 and the predetermined bending portion 114. The first electrostatic element 116 and the second electrostatic element 122 repel each other, such that the position of the neutral axis may remain the same as though the auxiliary layer 120 is not disposed without shifting towards the auxiliary layer 120.

Figure 1H:
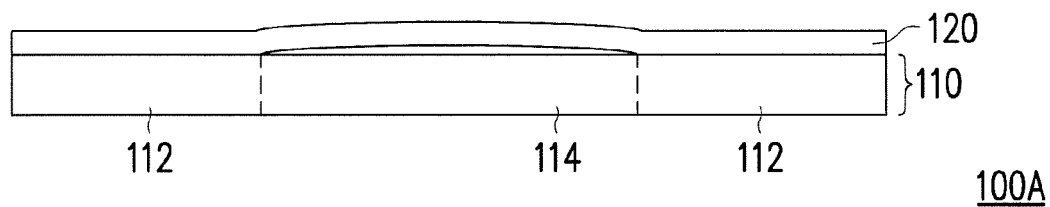
FIG. 1H is a schematic diagram illustrating an implementation of the auxiliary layer disposed on the flexible panel in the flexible electronic device of FIG. 1A.

FIG. 1H is a schematic diagram illustrating an implementation of the auxiliary layer disposed on the flexible panel in the flexible electronic device of FIG. 1A. Referring to FIG. 1H, in a flexible electronic device 100A, when the flexible panel 110 in unfolded (expanded into a flat state), a part of the auxiliary layer 120 corresponding to the predetermined bending portion 114 may be slightly raised, and remaining parts of the auxiliary layer 120 corresponding to the operation portion 112 may be securely attached on the operation portions 112. When the flexible panel 110 is bent in the manner of FIG. 1B, the auxiliary layer 120 may be in contact with the predetermined bending portion 114; and when the flexible panel 110 is bent in the manner of FIG. 1C, the auxiliary layer 120 is not in contact with the predetermined bending portion 114.

Figure 2:
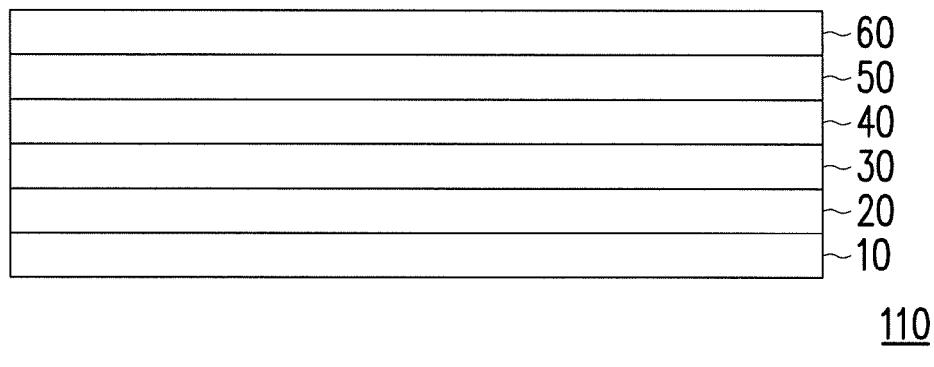
FIG. 2 is a schematic diagram of the flexible panel according to an embodiment of the present disclosure.

The flexible panel 110 may be a flexible display panel, a flexible touch display panel, a solar cell or a touch panel. Hereinafter, one of implementations of the flexible panel 110 is described by using the flexible touch display panel for example. FIG. 2 is a schematic diagram of the flexible panel according to an embodiment of the present disclosure. Referring to FIG. 2, the flexible panel 110 may include a carrier substrate 10, a driving element layer 20, a display medium layer 30, an encapsulation layer 40, an adhesion layer 50 and a touch sensing element layer 60, and a stacking sequence of aforesaid components may be adjusted based on demands. The driving element layer 20 is configured to drive the display medium layer 30 to display images, and the carrier substrate 10 and the encapsulation layer 40 package the driving element layer 20 and the display medium layer 30 therebetween. The touch sensing element layer 60 may be attached on the encapsulation layer 40 by the adhesion layer 50 so that the flexible panel 110 may include functions of displaying and touch sensing operations. Further, when the display medium layer 30 is an organic light-emitting layer, the flexible panel 110 may further include a moisture blocking layer or a lateral gas barrier structure.

The driving element layer 20 requires use of a conductive material or/and a semiconductor material in the manufacturing process, in which the common conductive material includes metal elements or an alloy of the metal elements or a metal oxide such as an indium tin oxide or an indium zinc oxide, and the common semiconductor material includes an amorphous silicon, a mono-silicon, a ploy-silicon and so on. Further, the conductive material may also be used to manufacture sensing electrodes in the touch sensing element layer 60. In aforesaid materials, a variety of materials (e.g., materials of the metal oxide, silicon materials of crystalline or non-crystalline) has a smaller yield strength for tensile stress, and a property thereof is brittle. Inorganic materials such as oxides and nitrides which are used in the moisture blocking layer or the lateral gas barrier structure also belong to a brittle material. Said materials may be regarded as the brittle material in the entire device, and a Young's modulus thereof is often greater than 50 GPa. When the materials are applied in the flexible electronic device of FIG. 1A, the components or a brittle material layer manufactured by the brittle material are tended to be disposed in the compressive stress region when bending, so as to extend the operating lifetime of the elements.

Figure 3A:
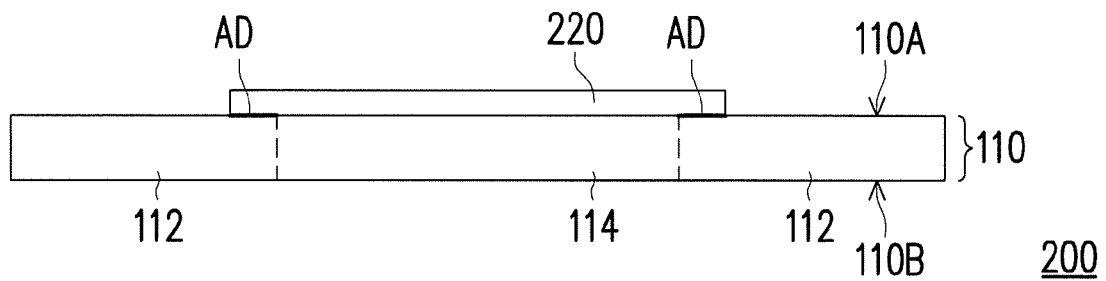
FIG. 3A is a cross-sectional view of a flexible electronic device according to another embodiment of the present disclosure.
Figure 3B:
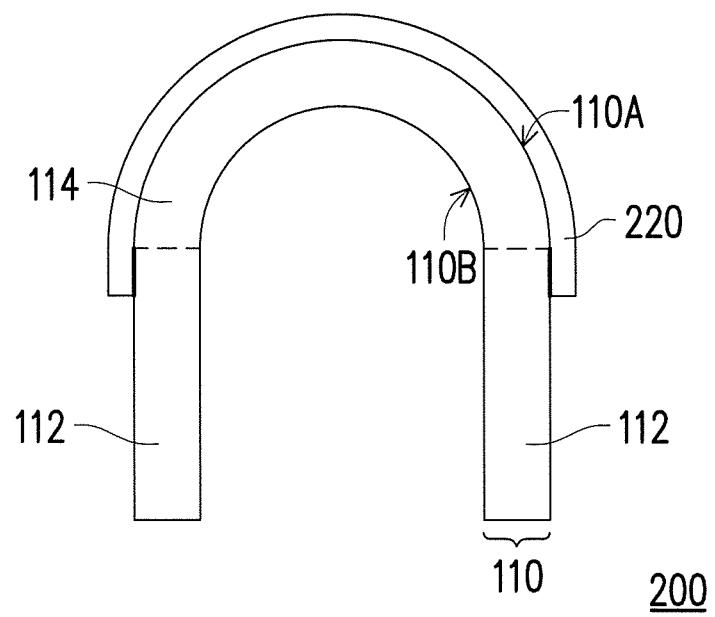
FIG. 3B is a schematic diagram of the flexible electronic device of FIG. 3A in the first bending state.
Figure 3C:
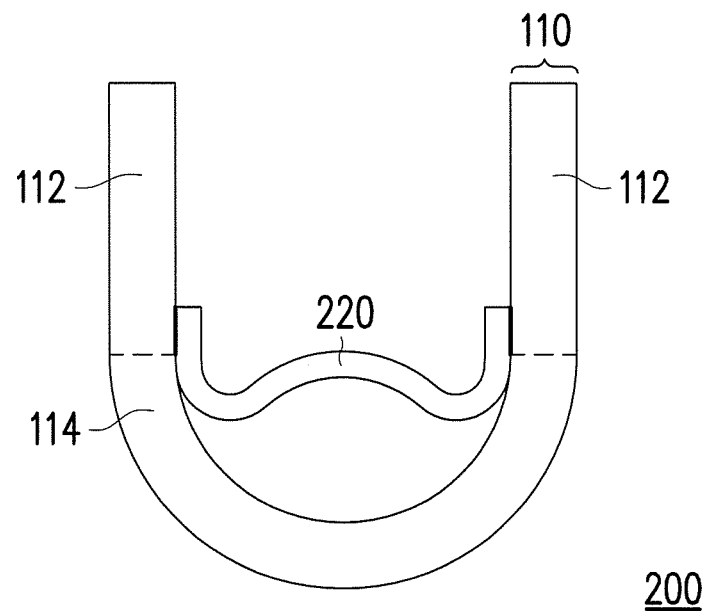
FIG. 3C is a schematic diagram of the flexible electronic device of FIG. 3A in the second bending state.

FIG. 3A is a cross-sectional view of a flexible electronic device according to another embodiment of the present disclosure; FIG. 3B is a schematic diagram of the flexible electronic device of FIG. 3A in the first bending state, and FIG. 3C is a schematic diagram of the flexible electronic device of FIG. 3A in the second bending state. Referring to FIG. 3A, a flexible electronic device 200 includes a flexible panel 110 and an auxiliary layer 220, in which the flexible panel 110 is identical to that in the foregoing embodiments and may refer to aforesaid description (which is not repeated hereinafter). The auxiliary layer 220 of the present embodiment may not be completely covered on the surface of the flexible panel 110 and disposed corresponding to the predetermined bending portion 114. The auxiliary layer 220 may be fixed at two sides of the predetermined bending portion 114 by an adhesion layer AD to expose a partial area of the operation portions 112. Further, the neutral axis may shift towards the auxiliary layer 220 when the auxiliary layer 220 disposed in the present embodiment is in contact with the predetermined bending portion 114 (as shown in FIG. 3B), and the position of the neutral axis may not be affected when the auxiliary layer 220 is not in contact with the predetermined bending portion 114 (as shown in FIG. 3C). Components and layers in the flexible panel 110 closer to the auxiliary layer 220 have higher possibility to fall within the compressive stress region and cannot be easily damaged by the bending stress.

Figure 4A:
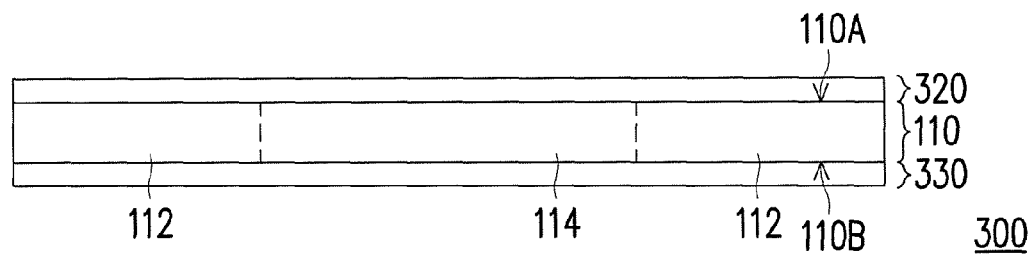
FIG. 4A is a cross-sectional view of a flexible electronic device according to another embodiment of the present disclosure.
Figure 4B:
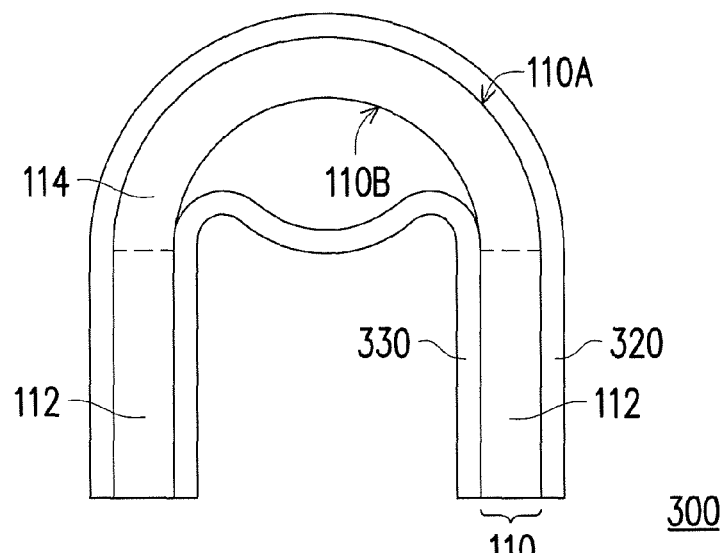
FIG. 4B is a schematic diagram of the flexible electronic device of FIG. 4A in the first bending state.
Figure 4C:
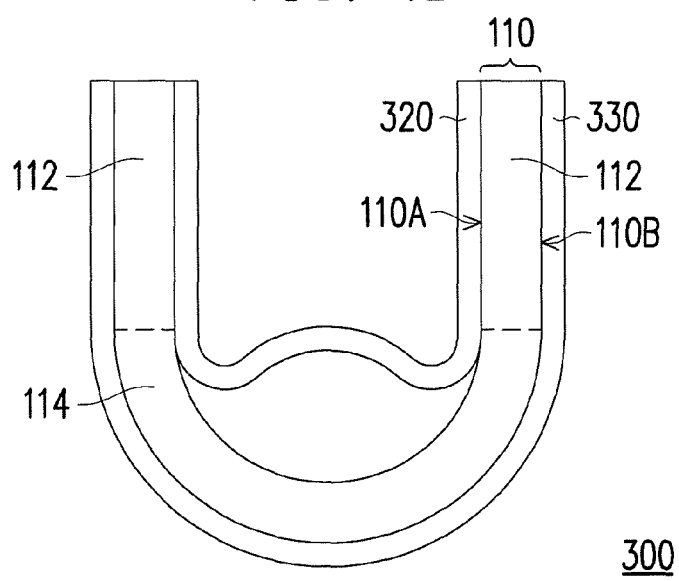
FIG. 4C is a schematic diagram of the flexible electronic device of FIG. 4A in the second bending state.

In the foregoing embodiments, the auxiliary layer is only disposed on one surface of the flexible panel, but the present disclosure is not limited thereto. FIG. 4A is a cross-sectional view of a flexible electronic device according to another embodiment of the present disclosure; FIG. 4B is a schematic diagram of the flexible electronic device of FIG. 4A in the first bending state, and FIG. 4C is a schematic diagram of the flexible electronic device of FIG. 4A in the second bending state. Referring to FIG. 4A, a flexible electronic device 300 includes a flexible panel 110 and a first auxiliary layer 320 and a second auxiliary layer 330, in which the flexible panel 110 is identical to that in the foregoing embodiments and may refer to aforesaid description (which is not repeated hereinafter). The first auxiliary layer 320 is located on the surface 110A of the flexible panel 110, the second auxiliary layer 330 is located on the surface 110B of the flexible panel 110, and the predetermined bending portion 114 is sandwiched between the first auxiliary layer 320 and the second auxiliary layer 330. In the present embodiment, materials, properties and effectivenesses of the first auxiliary layer 320 and the second auxiliary layer 330 are identical to those in the foregoing embodiments and may be understood with reference to the description for aforesaid auxiliary layer 120. In an embodiment, the first auxiliary layer 320 and the second auxiliary layer 330 may include different sizes (e.g., thicknesses), materials, characteristics, and so on. Alternatively, the first auxiliary layer 320 and the second auxiliary layer 330 may be manufactured by the same material, or include the same thickness, or include the same Young's modulus. Among them, the Young's modulus of the first auxiliary layer 320 and the second auxiliary layer 330 may be changed by using a physical parameter (e.g., voltage, temperature, etc.) or a phase transformation (e.g., solid phase, liquid crystal phase).

In view of FIG. 4B, when the predetermined bending portion 114 is in the first bending state, the first auxiliary layer 320 is located at the outer side and in contact with the predetermined bending portion 114, and the second auxiliary layer 330 is located at the inner side and not in contact with the predetermined bending portion 114. In this case, the neutral axis defined by the bending stress shifts towards the first auxiliary layer 320. According to related description of FIG. 1B, the range of the compressive stress region being greater than the range of the tensile stress region may lower the possibility for damaging the components or layers in the predetermined bending portion 114 by the bending stress. Hence, the flexible electronic device 300 is capable of providing an ideal operating lifetime.

In FIG. 4C, when the predetermined bending portion 114 is in a second bending state, the first auxiliary layer 320 is located at the inner side and not in contact with the predetermined bending portion 114, and the second auxiliary layer 330 is located at the outer side and in contact with the predetermined bending portion 114. In this case, the neutral axis defined by the bending stress shifts towards the second auxiliary layer 330. Under this condition, the range of the compressive stress region is increased to reduce the range of the tensile stress region. Overall, the function of either the first auxiliary layer 320 or the second auxiliary layer 330 is provided no matter which manner the flexible electronic device 300 adopts to bend, such that the range of the tensile stress region may be effectively reduced to ensure that the elements and the layers are not damaged by the bending stress.

Figure 5A:
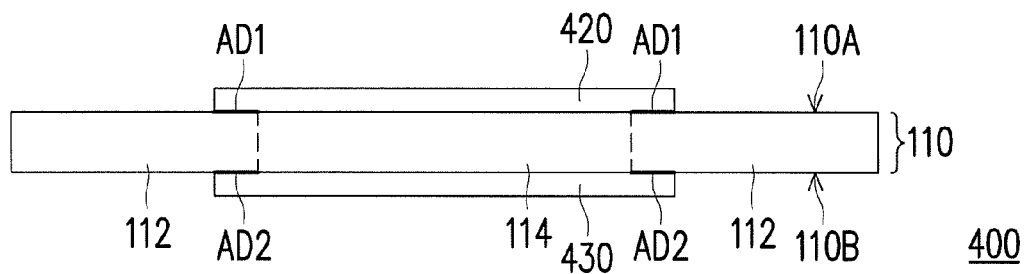
FIG. 5A is a cross-sectional view of a flexible electronic device according to another embodiment of the present disclosure.
Figure 5B:
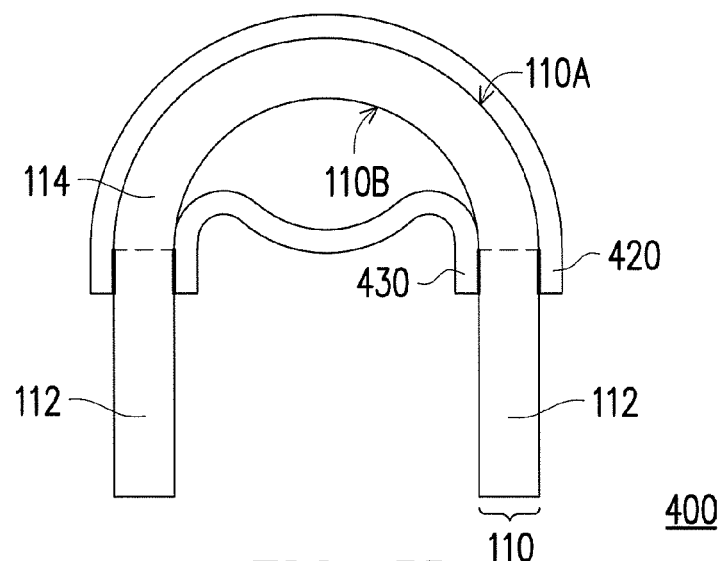
FIG. 5B is a schematic diagram of the flexible electronic device of FIG. 5A in the first bending state.
Figure 5C:
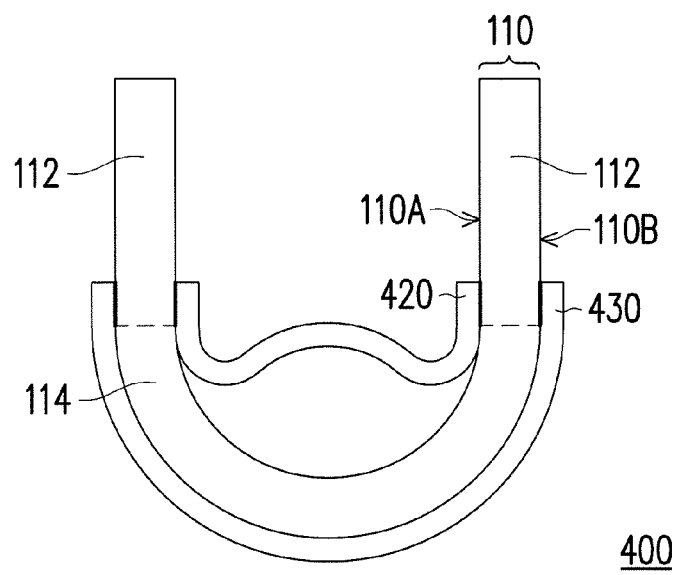
FIG. 5C is a schematic diagram of the flexible electronic device of FIG. 5A in the second bending state.

FIG. 5A is a cross-sectional view of a flexible electronic device according to another embodiment of the present disclosure; FIG. 5B is a schematic diagram of the flexible electronic device of FIG. 5A in the first bending state, and FIG. 5C is a schematic diagram of the flexible electronic device of FIG. 5A in the second bending state. Referring to FIG. 5A, a flexible electronic device 400 includes a flexible panel 110 and a first auxiliary layer 420 and a second auxiliary layer 430, in which the flexible panel 110 is identical to that in the foregoing embodiments and may refer to aforesaid description (which is not repeated hereinafter). The first auxiliary layer 420 and the second auxiliary layer 430 of the present embodiment may not be completely covered on the surface of the flexible panel 110 and disposed corresponding to the predetermined bending portion 114. The first auxiliary layer 420 and the second auxiliary layer 430 may be fixed at two sides of the predetermined bending portion 114 by adhesion layers AD1 and AD2 respectively, so as to expose a partial area of the operation portions 112. Further, the neutral axis may shift towards the first auxiliary layer 420 when the first auxiliary layer 420 and the second auxiliary layer 430 disposed in the present embodiment are in contact with the predetermined bending portion 114 (as shown in FIG. 5B), and the position of the neutral axis may not be affect when the first auxiliary layer 420 and the second auxiliary layer 430 are not in contact with the predetermined bending portion 114 (as shown in FIG. 5C).

In the foregoing embodiment, the flexible panel 110 has two operation portions 112 and one predetermined bending portion 114. However, in other embodiments, amounts of the operation portions 112 and the predetermined bending portion 114 may be decided based on product requirements instead of being limited to the above. One predetermined bending portion 114 may be disposed between each adjacent two of the operation portions 112 no matter what the amounts of the operation portions 112 and the predetermined bending portion 114 are.

Figure 6A:
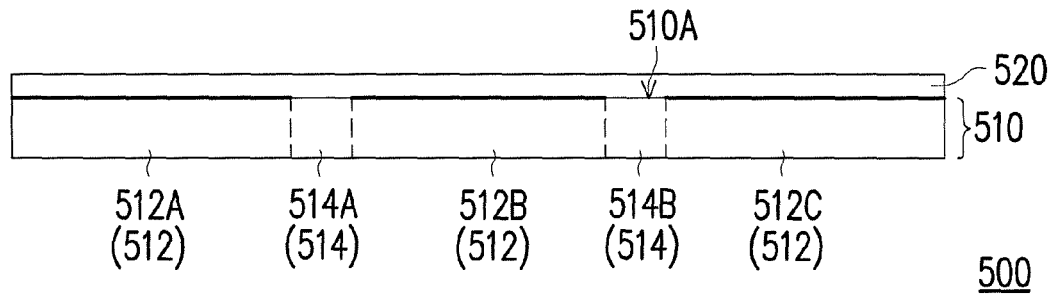
FIG. 6A is a schematic diagram of a flexible electronic device according to another embodiment of the present disclosure.
Figure 6B:
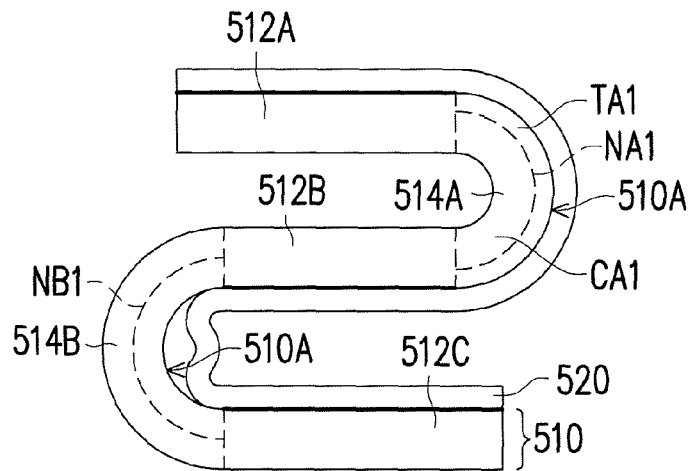
FIG. 6B and FIG. 6C are schematic diagrams respectively illustrating the flexible electronic device of FIG. 6A in different bending states.
Figure 6C:
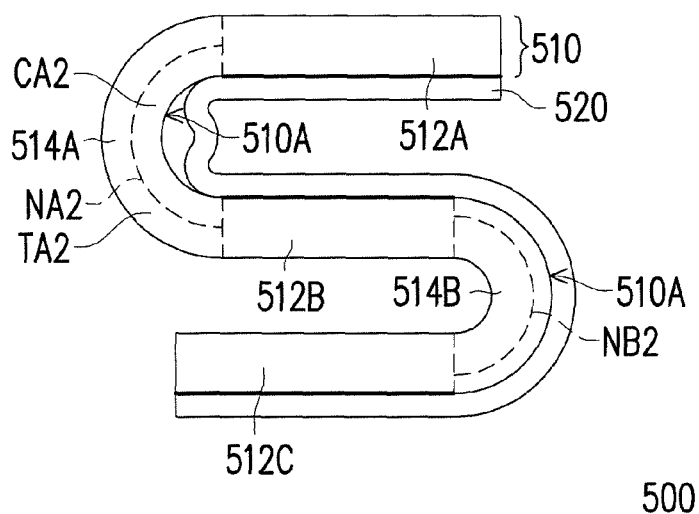

FIG. 6A is a schematic diagram of a flexible electronic device according to another embodiment of the present disclosure, and FIG. 6B and FIG. 6C are schematic diagrams respectively illustrating the flexible electronic device of FIG. 6A in different bending states. Referring to FIG. 6A, a flexible electronic device 500 includes a flexible panel 510 and an auxiliary layer 520. The flexible panel 510 may include a plurality of operation portions 512, and one predetermined bending portion 514 suitable for bending is disposed between each adjacent two of the operation portions 512. The operation portions 512 may be regarded as a major portion for providing functions such as displaying, touch operations and sensing and so on, whereas the predetermined bending portion 514 allows users to bend the entire device along the predetermined bending portion 514 when using the flexible electronic device 500. In an embodiment of the present disclosure, the predetermined bending portion 514 may also provide the functions such as displaying, touch operations and sensing and so on. The flexible panel 510 of the present embodiment may include, for example, three operation portions 512A, 512B and 512C, and two predetermined bending portions 514A and 514B. The first predetermined bending portion 514A is located between the first operation portion 512A and the second operation portion 512B, and the second predetermined bending portion 514B is located between the second operation portion 512B and the third operation portion 512C. The auxiliary layer 520 extends from above the first predetermined bending portion 514A to above the second predetermined bending portion 514B. In other words, the auxiliary layer 520 may substantially cover entire surface 510A.

In view of FIG. 6B, the first predetermined bending portion 514A is in the first bending state, such that the auxiliary layer 520 is in contact with the first predetermined bending portion 514A at the outer side. A neutral axis NA1 of the first predetermined bending portion 514A may be closer to the auxiliary layer 520. In such configuration, the range of the compressive stress region CA1 is greater than the range of the tensile stress region TA1 in the first predetermined bending portion 514A, such that most of the components and the layers are in a safe region. The second predetermined bending portion 514B is in a second bending state, such that the auxiliary layer 520 is not in contact with the second predetermined bending portion. In this case, a neutral axis NB1 of the second predetermined bending portion 514B does not shift towards the auxiliary layer 520, and thus no more components and layers may fall into the tensile stress region. In other words, the neutral axis NA1 is closer to the surface 510A because the auxiliary layer 520 is disposed, and the neutral axis NB1 not adjusted by the auxiliary layer 520 is farther from the surface 510A.

In FIG. 6C, the first predetermined bending portion 514A is in the second bending state, such that the auxiliary layer 520 is not in contact with the first predetermined bending portion 514A. The second predetermined bending portion 514B is in the first bending state, such that the auxiliary layer 520 is in contact with the second predetermined bending portion 514B at the outer side. In this case, the neutral axis NB2 of the second predetermined bending portion 514B may be closer to the auxiliary layer 520, and the neutral axis NA2 of the first predetermined bending portion 514A does not shift towards the auxiliary layer 520. The tensile stress region TA1 in the bending state of FIG. 6B may become the compressive stress region CA2 in the bending state of FIG. 6C, vice versa.

Figure 7A:
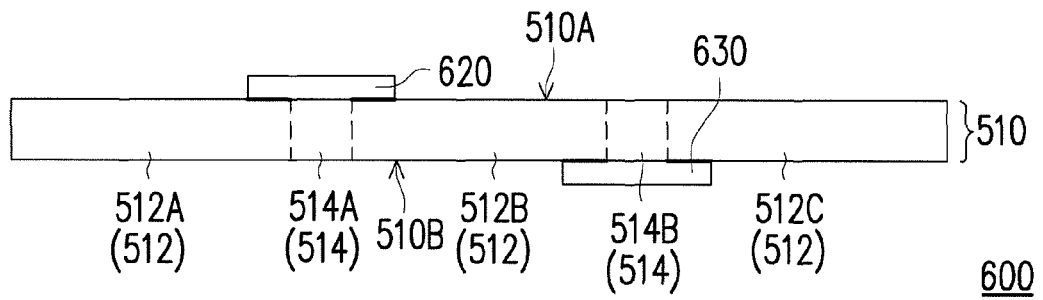
FIG. 7A is a schematic diagram of a flexible electronic device according to another embodiment of the present disclosure.
Figure 7B:
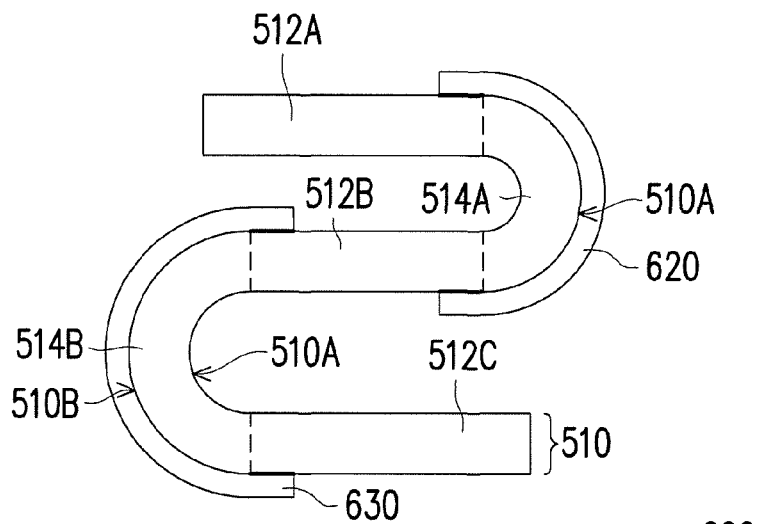
FIG. 7B and FIG. 7C are schematic diagrams respectively illustrating the flexible electronic device of FIG. 7A in different bending states.
Figure 7C:
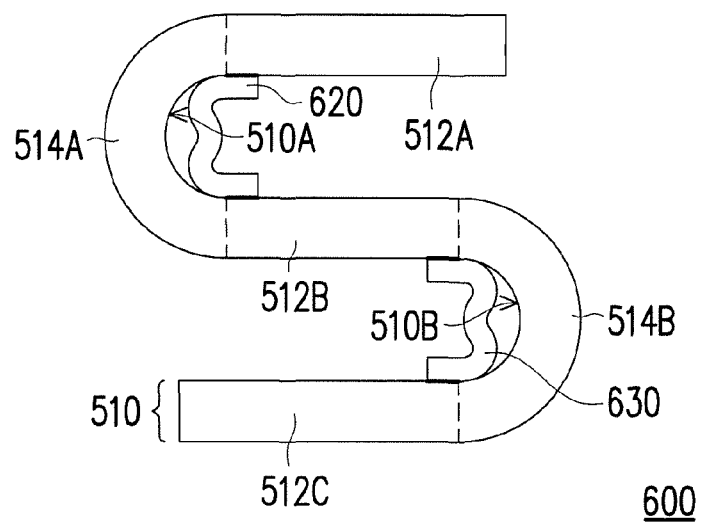

FIG. 7A is a schematic diagram of a flexible electronic device according to another embodiment of the present disclosure, and FIG. 7B and FIG. 7C are schematic diagrams respectively illustrating the flexible electronic device of FIG. 7A in different bending states. Referring to FIG. 7A, a flexible electronic device 600 includes a flexible panel 510 and a first auxiliary layer 620 and a second auxiliary layer 630. The flexible panel 510 may include, for example, three operation portions 512A, 512B and 512C, and two predetermined bending portions 514A and 514B. The first predetermined bending portion 514A is located between the first operation portion 512A and the second operation portion 512B, and the second predetermined bending portion 514B is located between the second operation portion 512B and the third operation portion 512C. The first auxiliary layer 620 is disposed on the first predetermined bending portion 514A, and the second auxiliary layer 630 is disposed on the second predetermined bending portion 514B.

In the present embodiment, the first auxiliary layer 620 and the second auxiliary layer 630 are disposed on different surfaces. That is, the first auxiliary layer 620 is disposed on a surface 510A of the flexible panel 510, the second auxiliary layer 630 is disposed on a surface 510E of the flexible panel 510, and the surface 510A and the surface 510B are opposite to each other. As shown in FIG. 7B, the first predetermined bending portion 514A and the second predetermined bending portion 514B are adapted to be bent in the same bending state, and the first auxiliary layer 620 and the second auxiliary layer 630 may be located at the outer side by such bending state. Accordingly, in the bending state of FIG. 7B, the range of the compressive stress region is increased in both the first predetermined bending portion 514A and the second predetermined bending portion 514B, so as to facilitate in preventing breakages and damages from occurring on the elements and the layers during the bending process.

In the bending state of FIG. 7C, the first predetermined bending portion 514A is adapted to be bent so that the first auxiliary layer 620 is surrounded by the first operation portion 512A, the second operation portion 512B and the first predetermined bending portion 514A, and the second predetermined bending portion 514B is adapted to be bent so that the second auxiliary layer 630 is surrounded by the second operation portion 512B, the third operation portion 512C and the second predetermined bending portion 514B. In this case, the first auxiliary layer 620 is not in contact with the first predetermined bending portion 514A and the second auxiliary layer 630 is not in contact with the second predetermined bending portion 514B.

Figure 8A:
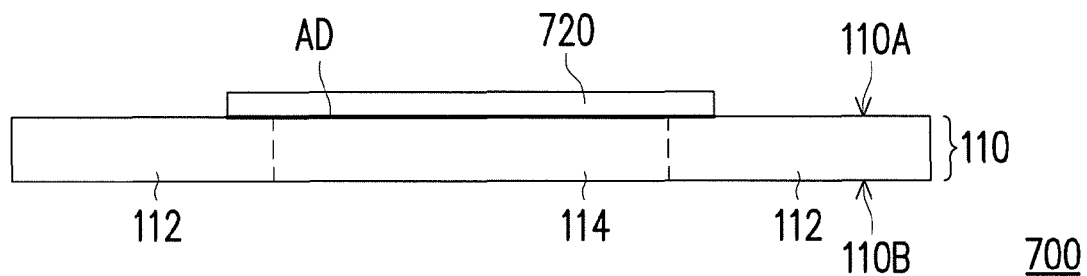
FIG. 8A is a schematic diagram of a flexible electronic device according to another embodiment of the present disclosure.
Figure 8B:
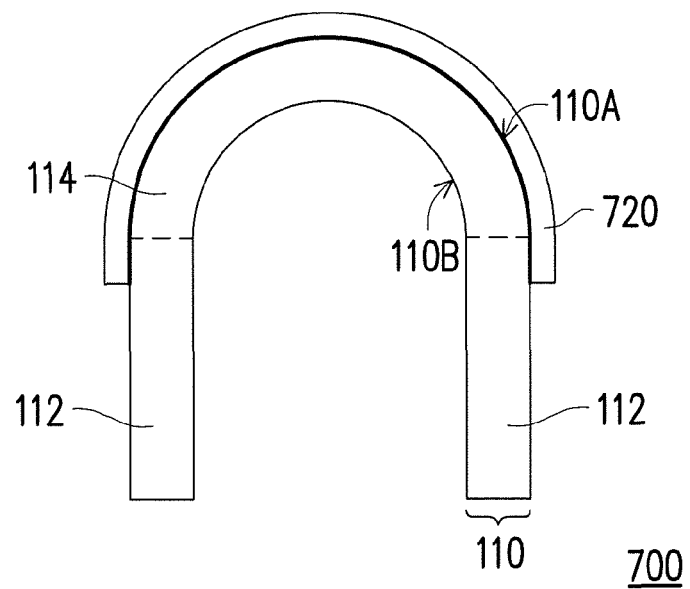
FIG. 8B is a schematic diagram of the flexible electronic device of FIG. 8A in the bending state.

FIG. 8A is a schematic diagram of a flexible electronic device according to another embodiment of the present disclosure, and FIG. 8B is a schematic diagram of the flexible electronic device of FIG. 8A in the bending state. Referring to FIG. 8A, a flexible electronic device 700 includes a flexible panel 110 and an auxiliary layer 720, in which a structural design and functions of the flexible panel 110 may refer to those cited in the foregoing embodiments. The auxiliary layer 720 is similar to the auxiliary layer 220 of FIG. 3A to FIG. 3C which exposes the operation portions 112 at the two sides. The auxiliary layer 720 of the present embodiment may be attached on the predetermined bending portion 114. In other words, the predetermined bending portion 114 and the auxiliary layer 720 are attached together by the adhesion layer AD thereinbetween. Accordingly, no matter the flexible panel 110 is in which bending state, the auxiliary layer 720 is attached on the predetermined bending portion 114 without being separated from the predetermined bending portion 114. In this case, the flexible panel 110 may be designed to be bent in a manner of FIG. 8B. In other words, the flexible panel 110 of the flexible electronic device 700 is bent such that the auxiliary layer 720 is located at the outer side.

In order to further describe effectiveness of the auxiliary layer, a plurality of simulation experiments are provided as follows. In the simulation experiments, a flexible panel may be aforesaid flexible panel 110 (e.g., implemented by the architecture in FIG. 2) in which the display medium layer is, for example, the organic light-emitting layer, the touch sensing element layer may adopt the indium tin oxide to serve as touch sensing electrodes, and the driving element layer may also adopt the indium tin oxide to serve as pixel electrodes.

In the simulation 1, the surface 110B is used as a display surface or one side where the touch sensing element layer 60 is located for example. When this device is not disposed with the auxiliary layer, the neutral axis is at a mid-depth. In other words, a distance from the neutral axis to the surface 110A when the auxiliary layer is not disposed is equal to a distance from the neutral axis to the surface 110B when the auxiliary layer is not disposed. A material of the auxiliary layer is, for example, a polypropylene (PP) having a thickness being 50 µm.

110A of this flexible electronic device is bent to be the outer side. However, when the auxiliary layer is disposed on the surface 110A, the factor of safety is increased to about 2.6 when the surface 110A is bent to be the outer side. In terms of experimental conditions, after the auxiliary layer is disposed, the factor of safety is increased by about 59.5%. Further, in a bending condition in which the surface 110B is bent to be the outer side, regardless of whether the auxiliary layer is disposed, the auxiliary layer is not in contact with the predetermined bending portion to affect the position of the neutral axis, such that the factor of safety remains the same.

In the simulation 2, the surface 110B is used as a display surface or one side where the touch sensing element layer 60 is located for example. The neutral axis is farther from the surface 110A when the auxiliary layer is not disposed, and the neutral axis is closer to the surface 110B when the auxiliary layer is not disposed. A material of the auxiliary

TABLE 1

|  |  | Bending direction | Material stress@radius of curvature = 3 mm | Material yield strength | Factor of safety (yield strength/stress) |
|---|---|---|---|---|---|
| The auxiliary layer is not disposed | The surface 110B is bent to be the outer side | Tensile stress | 598.5 MPa | 975 MPa | 1.63 |
| | | Compressive stress | 598.5 MPa | 1704 MPa | 2.85 |
| | The surface 110A is bent to be the outer side | Compressive stress | 598.5 MPa | 1704 MPa | 2.85 |
| | | Tensile stress | 598.5 MPa | 975 MPa | 1.63 |
| The auxiliary layer is disposed in the manner of FIG. 1A | The surface 110B is bent to be the outer side | Tensile stress | 598.5 MPa | 975 MPa | 1.63 |
| | | Compressive stress | 598.5 MPa | 1704 MPa | 2.85 |
| | The surface 110A is bent to be the outer side | Compressive stress | 823.1 MPa | 1704 MPa | 2.07 |
| | | Tensile stress | 373.9 MPa | 975 MPa | 2.60 |

In view of Table 1, when the auxiliary layer is not disposed, the factor of safety is only 1.63 when the surface layer is, for example, a polypropylene (PP) having a thickness being 50 µm.

TABLE 2

|  |  | Bending direction | Material stress@radius of curvature = 3 mm | Material yield strength | Factor of safety (yield strength/stress) |
|---|---|---|---|---|---|
| The auxiliary layer is not disposed | The surface 110B is bent to be the outer side | Tensile stress | 249 MPa | 975 MPa | 3.91 |
| | | Compressive stress | 948 MPa | 1704 MPa | 1.79 |
| | The surface 110A is bent to be the outer side | Compressive stress | 249 MPa | 1704 MPa | 6.84 |
| | | Tensile stress | 948 MPa | 975 MPa | 1.02 |

TABLE 2-continued

|  | Bending direction |  | Material stress@radius of curvature = 3 mm | Material yield strength | Factor of safety (yield strength/stress) |
|---|---|---|---|---|---|
| The auxiliary layer is disposed in the manner of FIG. 1A | The surface 110B is bent to be the outer side | Tensile stress | 249 MPa | 975 MPa | 3.91 |
|  |  | Compressive stress | 948 MPa | 1704 MPa | 1.79 |
|  | The surface 110A is bent to be the outer side | Compressive stress | 811 MPa | 1704 MPa | 2.10 |
|  |  | Tensile stress | 405 MPa | 975 MPa | 2.41 |

In view of Table 2, when the auxiliary layer is not disposed, the factor of safety is only 1.02 when the surface 110A of this flexible electronic device is bent to be the outer side. However, when the auxiliary layer is disposed on the surface 110A, the factor of safety is increased to about 2.41 when the surface 110A of this flexible electronic device is bent to be the outer side. In terms of experimental conditions, after the auxiliary layer is disposed, the factor of safety is increased by about 136.3%. Further, in a bending condition in which the surface 110B is bent to be the outer side, regardless of whether the auxiliary layer is disposed, the auxiliary layer is not in contact with the predetermined bending portion to affect the position of the neutral axis, such that the factor of safety remains the same.

In the simulation 3, the surface 110A is used as a display surface or one side where the touch sensing element layer 60 is located for example. When this device is not disposed with the auxiliary layer, the neutral axis is at a mid-depth. In other words, a distance from the neutral axis to the surface 110A when the auxiliary layer is not disposed is equal to a distance from the neutral axis to the surface 110B when the auxiliary layer is not disposed. A material of the auxiliary layer is, for example, a polypropylene (PP) having a thickness being 50 μm.

TABLE 3

|  | Bending direction |  | Material stress@radius of curvature = 3 mm | Material yield strength | Factor of safety (yield strength/stress) |
|---|---|---|---|---|---|
| The auxiliary layer is not disposed | The surface 110A is bent to be the outer side | Tensile stress | 598.5 MPa | 975 MPa | 1.63 |
|  |  | Compressive stress | 598.5 MPa | 1704 MPa | 2.85 |
|  | The surface 110B is bent to be the outer side | Compressive stress | 598.5 MPa | 1704 MPa | 2.85 |
|  |  | Tensile stress | 598.5 MPa | 975 MPa | 1.63 |
| The auxiliary layer is disposed in the manner of FIG. 1A | The surface 110A is bent to be the outer side | Tensile stress | 373.9 MPa | 975 MPa | 2.60 |
|  |  | Compressive stress | 823.1 MPa | 1704 MPa | 2.07 |
|  | The surface 110B is bent to be the outer side | Compressive stress | 598.5 MPa | 1704 MPa | 2.85 |
|  |  | Tensile stress | 598.5 MPa | 975 MPa | 1.63 |

In view of Table 3, when the auxiliary layer is not disposed, the factor of safety is only 1.63 when the surface 110A of this flexible electronic device is bent to be the outer side. However, when the auxiliary layer is disposed on the surface 110A, the factor of safety is increased to about 2.60 when the surface 110A of this flexible electronic device is bent to be the outer side. In terms of experimental conditions, after the auxiliary layer is disposed, the factor of safety is increased by about 59.5%. Further, in a bending condition in which the surface 110B is bent to be the outer side, regardless of whether the auxiliary layer is disposed, the auxiliary layer is not in contact with the predetermined bending portion to affect the position of the neutral axis, such that the factor of safety remains the same.

In the simulation 4, the surface 110A is used as a display surface or one side where the touch sensing element layer 60 is located for example. The neutral axis is farther from the surface 110A when the auxiliary layer is not disposed, and the neutral axis is closer to the surface 110B when the auxiliary layer is not disposed. A material of the auxiliary layer is, for example, a polypropylene (PP) having a thickness being 50 μm.

auxiliary layer is not in contact with the predetermined bending portion to affect the position of the neutral axis, such that the factor of safety remains the same.

In the simulation 5, the surface 110A is used as a display surface or one side where the touch sensing element layer 60 is located for example. When this device is not disposed with

TABLE 4

| | Bending direction | | Material stress@radius of curvature = 3 mm | Material yield strength | Factor of safety (yield strength/stress) |
|---|---|---|---|---|---|
| The auxiliary layer is not disposed | The surface 110A is bent to be the outer side | Tensile stress | 948 MPa | 975 MPa | 1.03 |
| | | Compressive stress | 249 MPa | 1704 MPa | 6.84 |
| | The surface 110B is bent to be the outer side | Compressive stress | 948 MPa | 1704 MPa | 1.80 |
| | | Tensile stress | 249 MPa | 975 MPa | 3.92 |
| The auxiliary layer is disposed in the manner of FIG. 1A | The surface 110A is bent to be the outer side | Tensile stress | 405 MPa | 975 MPa | 2.41 |
| | | Compressive stress | 811 MPa | 1704 MPa | 2.10 |
| | The surface 110B is bent to be the outer side | Compressive stress | 948 MPa | 1704 MPa | 1.80 |
| | | Tensile stress | 249 MPa | 975 MPa | 3.92 |

In view of Table 4, when the auxiliary layer is not disposed, the factor of safety is only 1.03 when the surface 110A of this flexible electronic device is bent to be the outer side. However, when the auxiliary layer is disposed on the surface 110A, the factor of safety is increased to about 2.41 when the surface 110A of this flexible electronic device is bent to be the outer side. In terms of experimental conditions, after the auxiliary layer is disposed, the factor of safety is increased by about 136.3%. Further, in a bending condition in which the surface 110B is bent to be the outer side, regardless of whether the auxiliary layer is disposed, the auxiliary layer, the neutral axis is at a mid-depth. In other words, a distance from the neutral axis to the surface 110A when the auxiliary layer is not disposed is equal to a distance from the neutral axis to the surface 110B when the auxiliary layer is not disposed. The present experiment is disposed with two auxiliary layers by adopting the manner of FIG. 4A to FIG. 4C, in which the first auxiliary layer is disposed on the surface 110A and the second auxiliary layer is disposed on the surface 110B. Each of the two auxiliary layers may be a PP material having a thickness of 50 μm.

TABLE 5

| | Bending direction | | Material stress@radius of curvature = 3 mm | Material yield strength | Factor of safety (yield strength/stress) |
|---|---|---|---|---|---|
| The auxiliary layer is not disposed | The surface 110A is bent to be the outer side | Tensile stress | 598.5 MPa | 975 MPa | 1.63 |
| | | Compressive stress | 598.5 MPa | 1704 MPa | 2.85 |
| | The surface 110B is bent to be the outer side | Compressive stress | 598.5 MPa | 1704 MPa | 2.85 |
| | | Tensile stress | 598.5 MPa | 975 MPa | 1.63 |
| The auxiliary layer is disposed in the manner | The surface 110A is bent to be the outer side | Tensile stress | 373.9 MPa | 975 MPa | 2.60 |
| | | Compressive stress | 823.1 MPa | 1704 MPa | 2.07 |

TABLE 5-continued

| | Bending direction | | Material stress@radius of curvature = 3 mm | Material yield strength | Factor of safety (yield strength/stress) |
|---|---|---|---|---|---|
| of FIG. 4A | The surface 110B is bent to be the outer side | Compressive stress | 823.1 MPa | 1704 MPa | 2.07 |
| | | Tensile stress | 373.9 MPa | 975 MPa | 2.60 |

In view of Table 5, when the auxiliary layer is not disposed, the factor of safety is only 1.63 when the surface 110A of this flexible electronic device is bent to be the outer side. However, when the auxiliary layer is disposed on the surface 110A, the factor of safety is increased to about 2.6 when the surface 110A of this flexible electronic device is bent to be the outer side. In addition, when the auxiliary layer is not disposed, the factor of safety is only 1.63 when the surface 110B of this flexible electronic device is bent to be the outer side. However, when the auxiliary layer is disposed on the surface 110B, the factor of safety is increased to about 2.6 when the surface 110B of this flexible electronic device is bent to be the outer side. In terms of experimental conditions, after the two auxiliary layers are disposed, the factor of safety is increased by about 59.5% regardless of which of the bending manners is used.

The flexible electronic device according to embodiments of the present disclosure adopts the auxiliary layer to adjust the position of the neutral axis in the bending state, so as to ensure that most of the elements manufactured by the brittle material fall into the compressive stress region or receive less tensile stress. Accordingly, the flexible electronic device according to the embodiments of the present disclosure may include a longer operating lifetime, and the brittle material therein cannot be easily damaged during the bending process.

It will be clear that various modifications and variations can be made to the disclosed embodiments. It is intended that the specification and examples be considered as exemplary only, with a true scope of the disclosure being indicated by the following claims and their equivalents

What is claimed is:

1. A flexible electronic device, comprising:
   a flexible panel having a plurality of operation portions and a predetermined bending portion disposed between each adjacent two of the operation portions, wherein the flexible panel comprises at least one brittle material layer manufactured by a brittle material; and
   an auxiliary layer, disposed on a surface of the flexible panel and at least located above the predetermined bending portion, wherein when the predetermined bending portion of the flexible panel is in a first bending state, the auxiliary layer is in contact with the predetermined bending portion, and a radius of curvature of the auxiliary layer is greater than a radius of curvature of the predetermined bending portion, and wherein in the first bending state, the flexible electronic device has a first compressive stress region and a first tensile stress region, a range of the first compressive stress region is greater than a range of the first tensile stress region, and the brittle material layer manufactured by the brittle material is located in the first compressive stress region, wherein when the predetermined bending portion is in a second bending state, the auxiliary layer is not in contact with the predetermined bending portion.

2. The flexible electronic device of claim 1, wherein a Young's modulus of the brittle material is greater than 50 GPa.

3. The flexible electronic device of claim 1, wherein the auxiliary layer is located in the first tensile stress region.

4. The flexible electronic device of claim 1, wherein when the predetermined bending portion is in the second bending state, the auxiliary layer is surrounded by the two of the operation portions and the predetermined bending portion.

5. The flexible electronic device of claim 4, wherein the auxiliary layer covers the two of the operation portions.

6. The flexible electronic device of claim 1, wherein the operation portion comprises a first operation portion, a second operation portion and a third operation portion, the predetermined bending portion comprises a first predetermined bending portion and a second predetermined bending portion, the first predetermined bending portion is located between the first operation portion and the second operation portion, and the second predetermined bending portion is located between the second operation portion and the third operation portion.

7. The flexible electronic device of claim 6, wherein the auxiliary layer extends from a location above the first predetermined bending portion to a location above the second predetermined bending portion.

8. The flexible electronic device of claim 6, wherein the auxiliary layer comprises a first auxiliary layer disposed on the first predetermined bending portion and a second auxiliary layer disposed on the second predetermined bending portion, the first auxiliary layer is located on a first surface of the flexible panel and the second auxiliary layer is located on a second surface of the flexible panel, and the first surface is opposite to the second surface.

9. The flexible electronic device of claim 1, wherein a Young's modulus of the auxiliary layer is between 0.2 GPa to 8 GPa.

10. The flexible electronic device of claim 1, wherein the auxiliary layer comprises a first auxiliary layer and a second auxiliary layer, the first auxiliary layer is located on a first surface of the flexible panel and the second auxiliary layer is located on a second surface of the flexible panel, and the predetermined bending portion is located between the first auxiliary layer and the second auxiliary layer.

11. The flexible electronic device of claim 1, wherein the flexible panel comprises a carrier substrate, a driving element layer, a display medium layer and an encapsulation layer, the driving element layer is configured to drive the display medium layer, and the driving element layer and the display medium layer are located between the carrier substrate and the encapsulation layer.

12. A flexible electronic device, comprising:
a flexible panel, having a plurality of operation portions and a predetermined bending portion disposed between each adjacent two of the operation portions; and
an auxiliary layer, disposed on a surface of the flexible panel and at least located above the predetermined bending portion, wherein when the predetermined bending portion of the flexible panel is in a first bending state, the auxiliary layer is in contact with the predetermined bending portion, and a radius of curvature of the auxiliary layer is greater than a radius of curvature of the predetermined bending portion, and wherein when the predetermined bending portion of the flexible panel is in a second bending state, the auxiliary layer is not in contact with the predetermined bending portion.

13. The flexible electronic device of claim 12, wherein the flexible panel has a first electrostatic element disposed in the predetermined bending portion, and the auxiliary layer has a second electrostatic element, wherein the first electrostatic element and the second electrostatic element attract each other in the first bending state, and the first electrostatic element and the second electrostatic element repel each other in the second bending state.

14. The flexible electronic device of claim 12, wherein a part of the auxiliary layer is fixed on the operation portions by an adhesion layer.

15. The flexible electronic device of claim 12, wherein the auxiliary layer covers the two of the operation portions.

16. The flexible electronic device of claim 12, wherein the operation portion comprises a first operation portion, a second operation portion and a third operation portion, the predetermined bending portion comprises a first predetermined bending portion and a second predetermined bending portion, the first predetermined bending portion is located between the first operation portion and the second operation portion, and the second predetermined bending portion is located between the second operation portion and the third operation portion.

17. The flexible electronic device of claim 16, wherein the auxiliary layer extends from a location above the first predetermined bending portion to a location above the second predetermined bending portion.

18. The flexible electronic device of claim 16, wherein the auxiliary layer comprises a first auxiliary layer disposed on the first predetermined bending portion and a second auxiliary layer disposed on the second predetermined bending portion, the first auxiliary layer is located on a first surface of the flexible panel and the second auxiliary layer is located on a second surface of the flexible panel, and the first surface is opposite to the second surface.

19. The flexible electronic device of claim 12, wherein the auxiliary layer comprises a first auxiliary layer and a second auxiliary layer, the first auxiliary layer is located on a first surface of the flexible panel and the second auxiliary layer is located on a second surface of the flexible panel, and the predetermined bending portion is located between the first auxiliary layer and the second auxiliary layer.

20. The flexible electronic device of claim 12, wherein the auxiliary layer is attached on the predetermined bending portion and exposes the operation portions.

* * * * *